United States Patent
Monroe et al.

(10) Patent No.: US 9,286,181 B2
(45) Date of Patent: Mar. 15, 2016

(54) APPARATUS FOR CAPTURING RESULTS OF MEMORY TESTING

(71) Applicant: GLOBALFOUNDRIES INC., Grand Cayman (KY)

(72) Inventors: Craig M. Monroe, South Burlington, VT (US); Michael R. Ouellette, Westford, VT (US); Douglas E. Sprague, Ellsworth, ME (US); Michael A. Ziegerhofer, Jeffersonville, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 84 days.

(21) Appl. No.: 13/955,401

(22) Filed: Jul. 31, 2013

(65) Prior Publication Data

US 2015/0039950 A1 Feb. 5, 2015

(51) Int. Cl.
*G01R 31/28* (2006.01)
*G06F 11/27* (2006.01)
*G11C 29/44* (2006.01)
*G11C 29/56* (2006.01)
*G11C 29/12* (2006.01)

(52) U.S. Cl.
CPC .............. *G06F 11/27* (2013.01); *G11C 29/44* (2013.01); *G11C 29/56008* (2013.01); *G11C 2029/1208* (2013.01); *G11C 2029/4402* (2013.01); *G11C 2029/5606* (2013.01)

(58) Field of Classification Search
CPC ................. G01R 31/3185; G01R 31/318342; G01R 31/318541; G01R 31/318583; G01R 31/318572; G01R 31/2889; G01R 31/31926; G01R 31/31905; G01R 35/00; G01R 31/3004; G01R 31/31858; G01R 31/318577; G11C 29/20; G11C 5/04; G11C 2029/3602; G06F 13/4243
See application file for complete search history.

(56) References Cited

U.S. PATENT DOCUMENTS

| | | | | |
|---|---|---|---|---|
| 5,517,637 | A * | 5/1996 | Bruce et al. | ...................... 703/15 |
| 5,805,608 | A | 9/1998 | Baeg et al. | |
| 6,381,719 | B1 | 4/2002 | Scheck | |
| 6,456,961 | B1 * | 9/2002 | Patil et al. | ........................ 703/14 |
| 6,539,531 | B2 * | 3/2003 | Miller et al. | .................. 716/106 |

(Continued)

OTHER PUBLICATIONS

Kay, D. "Impact of DFT on Test". Cisco. Silicon Valley Test Conference & Expo 2010. San Jose, Nov. 8-9, 2010. <www.svtest.com>.

(Continued)

*Primary Examiner* — Guerrier Merant
(74) *Attorney, Agent, or Firm* — David Cain; Hoffman Warnick LLC

(57) ABSTRACT

A method to produce a description file of Joint Test Action Group (JTAG) capture-shift test data registers to be used to interpret a test result of a memory included in an integrated circuit structure that is configured for testing integrated circuit memory. A computer extracts, from a first data file, the names a memory built in self test instance, a memory built in self test port name, and a name of a first memory. The first data file controls the hierarchical and architectural arrangement of components of an integrated circuit. The first data file describes a hierarchical order of an architectural arrangement of the components, electrical pathways, and connections between the components and the electrical pathways of an integrated circuit design. The computer adds the extracted names into the description file such that the description file is configured to interpret a test result of a memory.

19 Claims, 4 Drawing Sheets

(56) References Cited

U.S. PATENT DOCUMENTS

| | | | |
|---|---|---|---|
| 6,671,843 B1* | 12/2003 | Kebichi et al. | 714/733 |
| 7,149,921 B1* | 12/2006 | Zorian et al. | 714/6.1 |
| 7,269,805 B1* | 9/2007 | Ansari et al. | 716/136 |
| 7,305,603 B1 | 12/2007 | Stenfort | |
| 7,653,849 B1* | 1/2010 | Tabatabaei | 714/726 |
| 7,757,198 B1 | 7/2010 | Zhao et al. | |
| 8,239,818 B1 | 8/2012 | Monroe et al. | |
| 8,280,687 B2* | 10/2012 | Cheng et al. | 702/185 |
| 8,788,886 B2* | 7/2014 | Chong et al. | 714/38.11 |
| 2002/0073374 A1* | 6/2002 | Danialy et al. | 714/738 |
| 2003/0115522 A1* | 6/2003 | Nadeau-Dostie et al. | 714/726 |
| 2003/0149915 A1* | 8/2003 | Yamada | 714/31 |
| 2005/0262465 A1* | 11/2005 | Goyal | 716/18 |
| 2005/0273683 A1* | 12/2005 | Cote et al. | 714/726 |
| 2006/0273809 A1* | 12/2006 | Miller et al. | 324/754 |
| 2007/0011542 A1* | 1/2007 | Mukherjee et al. | 714/738 |
| 2007/0113054 A1 | 5/2007 | Guibert et al. | |
| 2008/0005710 A1* | 1/2008 | Fomaciari et al. | 716/6 |
| 2009/0210763 A1 | 8/2009 | Eckelman et al. | |
| 2010/0005281 A1* | 1/2010 | Buchmann et al. | 713/2 |
| 2010/0180154 A1* | 7/2010 | Bellows | 714/30 |
| 2013/0055023 A1* | 2/2013 | Chong et al. | 714/30 |

OTHER PUBLICATIONS

"JTAG Interface: Simple Introduction". montec. amt_ann004 (v1.0) Application Note. Nov. 16, 2005. <http://www.amontec.com>.

U.S. Appl. No. 13/365,370, filed Feb. 3, 2012.

U.S. Appl. No. 13/685,779, filed Nov. 27, 2012.

* cited by examiner

APPARATUS FOR CAPTURING RESULTS OF MEMORY TESTING

FIELD OF THE INVENTION

The present invention relates generally to the field of integrated circuits, and more particularly to on-chip testing of integrated circuit memory.

BACKGROUND OF THE INVENTION

Recent advances in integrated circuit technology have largely been accomplished by decreasing the feature size of circuit elements on a semiconductor chip. This decreasing feature size makes it possible to incorporate increasingly more circuitry into a single semiconductor chip. This has enabled processor designers to incorporate multiple processor cores into a single microprocessor chip design (i.e., uP designs). A similar approach has also been applied to non-uP ASIC designs.

Unfortunately, as integrated circuit, such as microprocessor chips, become increasingly more complicated, it is becoming harder to test all of the structures in an integrated circuit. Logic circuitry and flip-flops within a microprocessor chip can be tested using scan techniques and automatic test pattern generation (ATPG). However, scan techniques cannot adequately test on-chip memory structures, such as cache memories or translation-lookaside buffers (TLBs).

For testing on-chip memory structures, a sequence of read and write operations in a specific addressing sequence is required to test for failure modes. Such control logic that generates this sequence and checks the results is typically designed to test memory structures. This control logic is referred to as "MBIST" engines in known solutions. A memory built in self test (MBIST) engine is a finite state machine, which is located in close proximity to a memory structure and is configured to perform successive read and write operations to the memory structure to test the memory structure. However, as more and more memory structures, such as cache memories, TLBs and Branch History Tables (BHTs), are incorporated into microprocessor chips, it is becoming impractical for chip designers to create MBIST structures without the use of computer automation.

SUMMARY

A method of producing a description file of Joint Test Action Group (JTAG) capture-shift test data registers and an integrated circuit structure configured for testing integrated circuit memory using the description file of Joint Test Action Group (JTAG) capture-shift test data registers. The method of producing a description file of Joint Test Action Group (JTAG) capture-shift test data registers comprising a computer extracting, from a first data file the names of a memory built in self test instance, a memory built in self test port name, and a name of a first memory. The first data file controls the hierarchical and architectural arrangement of components of an integrated circuit. The first data file describes a hierarchical order of an architectural arrangement of the components, electrical pathways, and connections between the components and the electrical pathways of at least a part of an integrated circuit design. The computer adds the extracted names into a description file that describes JTAG capture-shift test data registers such that the description file is configured to interpret a test result of a memory. The memory is included in an integrated circuit structure that is configured for testing integrated circuit memory using the description file of Joint Test Action Group (JTAG) capture-shift test data registers.

DETAILED DESCRIPTION

Known solutions for the testing of test on-chip memory structures, such as cache memories or translation-lookaside buffers (TLBs) utilize memory built in self test (MBIST) engines. These solutions require the manual coding of many custom connection commands. In addition many "sysdone" and "sysfail" signals are required to be routed and connected up through the design hierarchy of the chip. This significantly increases the complexity by requiring the use of many new ports and corresponding wires to be added to the design.

Figure 1:
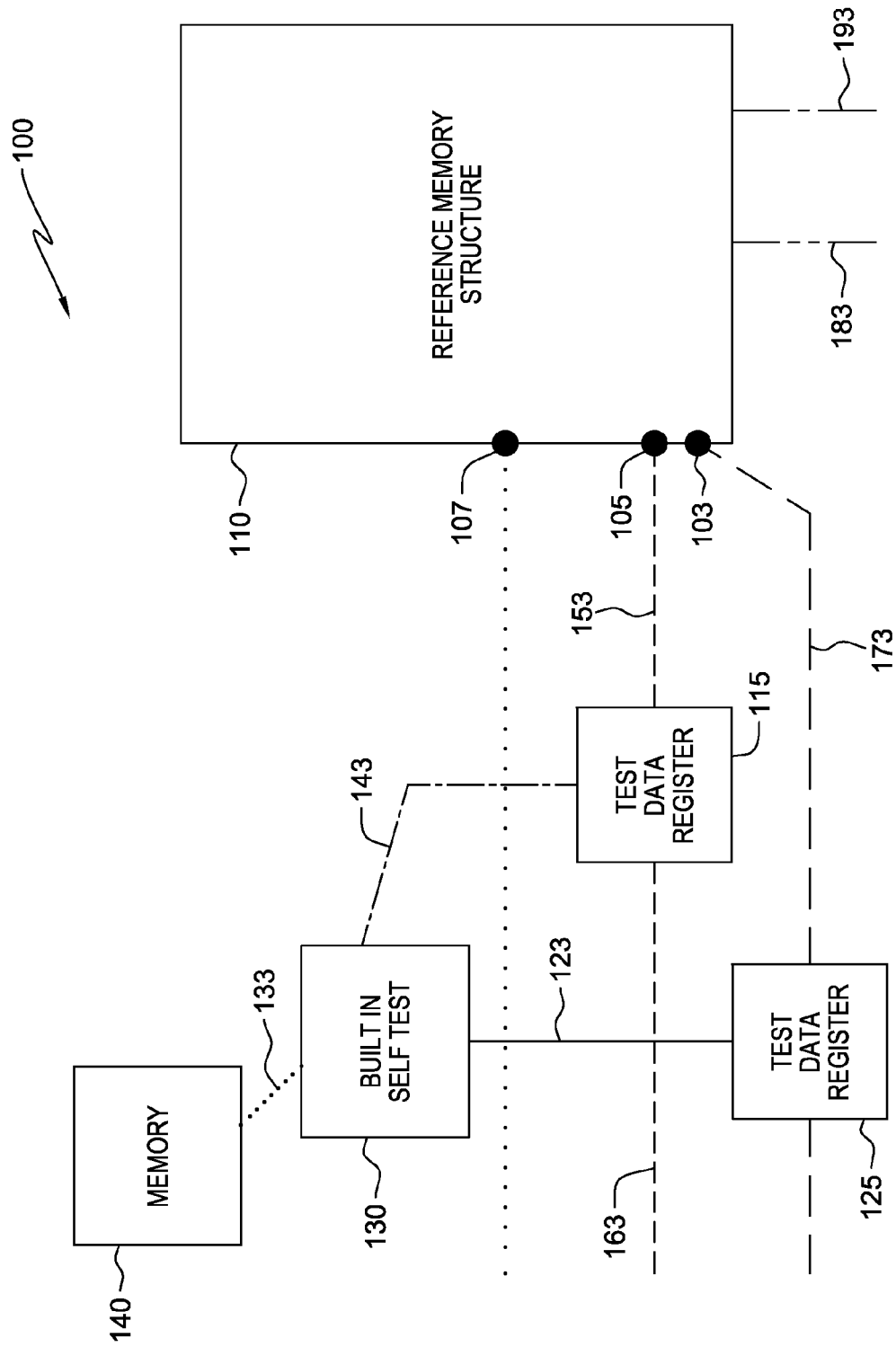
FIG. 1 is a functional block diagram illustrating a memory testing apparatus, in accordance with an embodiment of the present invention.

The present invention will now be described in detail with reference to the Figures. FIG. 1 is a block diagram illustrating a memory testing apparatus 100 that is based on an organizational file, in accordance with one embodiment of the present invention.

In various embodiments of the present invention, a given memory testing apparatus is created using an organizational file. A method for creating and using such an organizational file is described in IBM® patent application Ser. No. 13/080,055, entitled "Data Structure for Describing MBIST Architecture," herein incorporated by reference. The organizational file indicates the location of components and their respective electrical contacts with a plurality of electrical pathways of the memory testing apparatus. Therefore, the components, electrical pathways, and connections therebetween, of the memory testing apparatus, mimic a) a hierarchical order of components, b) an arrangement of components, and c) electrical connections as indicated by the organizational file. The use of such an organizational file is herein used to automatically insert a hierarchical in-system test observe structure as well as for the generation of a description file of Joint Test Action Group (JTAG) capture-shift test data registers. The result of a test using the automatically inserted hierarchical in-system test observe structures can then be analyzed using the generated description file of Joint Test Action Group (JTAG) capture-shift test data registers. By defining the ordering of in-system test observe readout sequences, based on the organizational file, the task of deciphering in-system test results using the generated description file is facilitated.

Memory testing apparatus 100, includes a reference memory structure 110, test data register (TDR) 115 and 125, built in self test (BIST) 130, memory 140, and electrical pathway 123, 133, 143, 153, 163, 173, 183, and 193. Reference memory structure 110 includes a previously processed memory and is used during the testing of memory 140, which is to be tested. Reference memory structure 110 is a previously processed memory, i.e., memory that has been previously tested, that is needed to understand the overall hierarchical scheme of the MBIST layout and to understand an MBIST state readout generated by the testing of memory 140. Memory 140 is an integrated circuit memory, such as a cache memory, a translation-lookaside buffer (TLB), or a Branch History Table (BHT). Memory 140 is connected to BIST 130 via electrical pathway 133. BIST 130 is in turn respectively connected to TDR 115 and 125 via electrical pathway 123 and 143.

In exemplary embodiments, TDR 115 and 125 are used to capture MBIST state readouts. TDR 115 and 125 are data registers that work in conjunction with BIST 130 to capture the readout of the state of testing during a test memory 140. In the overall hierarchical scheme of the MBIST layout of memory testing apparatus 100, to perform proper MBIST insertion/checking as well as the proper new insertion of the TDR 115 and 125, an organization file, such as organizational file 290, is utilized. BIST 130 is an integrated circuit structure designed to test memory. BIST 130 is typically on-chip circuitry that is added to generate test vectors or analyze output responses or both.

In certain embodiments, there may be a plurality of memory 140 components that are each respectively connected to at least one BIST 130. In such embodiments, each respective memory 140 has a corresponding TDR 115. Each TDR 115 is respectively connected to electrical pathway 163 and 153 via electrical pathway 143, such that the signals carried by both electrical pathway 163 and 153 can be received by TDR 115. In exemplary embodiments, electrical pathway 143 carries signals to and from TDR 115, thereby providing communication between BIST 130 and TDR 115. In embodiments that include a plurality of memory 140 components, the "daisy chain" created by a plurality of TDR 115 is indicated by the organizational file and is represented in the description file of Joint Test Action Group (JTAG) capture-shift test data registers.

Further, in certain embodiments, there may be a plurality of BIST 130 components. In such a case, each respective BIST 130 has a corresponding TDR 125, which is also represented in the description file. Each TDR 125 is respectively connected to electrical pathway 173 and 153 via a respective electrical pathway 123, such that the signals carried by both electrical pathway 173 and 153 can be received by TDR 125. In exemplary embodiments, electrical pathway 123 carries signals to and from TDR 125, thereby providing communication between BIST 130 and TDR 125. In embodiments that include a plurality of BIST 130 components, "daisy chain" created by such a plurality of BIST 130 components is also represented in the description file.

As seen in FIG. 1, TDR 125 is connected to electrical pathway 173. Electrical pathway 173 carries a reference signal that is used to determine whether the test of memory 140 has been completed, e.g., a test data in signal for SYSDONE. Electrical pathway 173 is also connected to reference memory structure 110 via input point 103. This connection, i.e., input point 103, allows signals to be passed from TDR 125 to reference memory structure 110 via Electrical pathway 173.

As seen in FIG. 1, TDR 115 is connected to electrical pathway 163. Electrical pathway 163 carries a reference signal that is used to determine whether memory 140 has failed the test of memory, e.g., a test data in signal for SYSFAIL. Electrical pathway 163 is also connected to reference memory structure 110 via input point 105. This connection, i.e., input point 105, allows signals to be passed from TDR 115 to reference memory structure 110 via electrical pathway 163.

Reference memory structure 110 is also connected to electrical pathway 153 via input point 107. Input point 107, allows signals to be passed from electrical pathway 153 to reference memory structure 110. Electrical pathway 153 typically carries a plurality of control signals that control the testing of memory 140, e.g., broadcast signals that control the testing of memory 140. Such control signals include signals such as test access port controller (TAP) signals, such as capture drive state, test reset, and test clock signals. Reference memory structure 110 is connected to electrical pathway 183 and 193. Electrical pathway 183 carries signals that indicate which memory 140, if any, have failed the test, e.g., test data out (TDO) signals for SYSFAIL daisy chains. Electrical pathway 193 carries signals that indicate the completion of the test of memory 140, e.g., test data out (TDO) signals for SYSDONE daisy chains. These signals are then analyzed, using the description file, to identify the specific memory 140 that have passed or failed the memory test.

In exemplary embodiments, signals carried by electrical pathway 163 and 173 are respectively processed in a hierarchical order that corresponds to a processing order as indicated by the organization file. Further TDR 115 and 125 are inserted into an integrated circuit design or a sub-component of an integrated circuit design such that a respective serial order of TDR 115 and 125 is defined by the order of memory built in self test sub-components as they appear in the organization file. TDR 115 and 125 are configured to observe the results of a memory built in self test operation that uses a memory built in self test architecture arrangement.

In exemplary embodiments, the organization file is used to generate commands to insert the necessary test data registers (such as TDR 115 and 125) which form the SYSDONE and SYSFAIL daisy chains. The insertion of such test data registers is based on the BIST engines, e.g., BIST 130, and memories to be tested, e.g., memory 140, that are included in the organization file, respectively. The organization file is used to generate commands to insert the necessary ports for both the SYSDONE and SYSFAIL daisy chains. In the case of a chip-top, the test data in and out ports that are added are PI/PO access ports at chip-top, which are used for SYSDONE and SYSFAIL access. The organization file is also used to generate all the commands required to connect the components used by memory testing apparatus, e.g., memory testing apparatus 100. These commands include commands to create connections for daisy chains, test data register broadcast signals, BIST 130 to TDR 115 and 125 for individual SYSDONE and SYSFAIL signals, as well as any required connections to lower level reference components, if any exist.

The following table, 1, includes a part of an organization file used to define and insert MBIST components into an integrated circuit.

TABLE 1 part of an organization file

```
# Org file - Fig6-Block1

# Element / Cell Name          Hierarchical        Clock Source
# (plus prefix tokens)         Instance Name       Instance/Pin
#                              (Relative to        and Phase           Parameter
#                              current block)      (+/-)               Values
hier_ref=Block1
view=WRAP_FUSECNTL_ref1
    bcntl BISTCNTLT09              BC1                                                     -
        bist BIST1SDBT09              W11_1_BIST1SDBT09                                    -
            mem WRAPT2A_UVT_T09_SRAM1DFCMG00512X032D04C128_AFLAT_TIE W11_1                 -
            mem WRAPT2A_UVT_T09_SRAM1DFCMG00512X032D04C128_AFLAT_TIE W11_2                 -
        bist BIST2SABT09              W12_1_BIST2SABT09                                    -
            mem WRAPT2A_UVT_T09_SRAM2SFCMG01152X016D04C064_AFLAT_TIE W12_1                 -
            mem WRAPT2A_UVT_T09_SRAM2SFCMG01152X016D04C064_AFLAT_TIE W12_2                 -
end_view
end_hier_ref
```

The following table, 2, includes a daisy chain ordering that is used to identify the pin connections using the part of an organization file used to define and insert MBIST components into an integrated circuit shown above.

TABLE 2 daisy chain ordering that is used to identify the pin connections

```
SYSDONE chain order (BIST engine instance name & DONE pins are listed)
Inst_A.W11_1_BIST1SDBT09.SYSDONE
Inst_A.W12_1_BIST2SABT09.SYSDONE
W21_1_BIST1SDBT09.SYSDONE
W22_1_BISTDRAMAHCFWRAPT09.SYSDONE
Inst_B.W31_1_BIST2SUBT09.SYSDONE
Inst_B.W32_1_BIST2RACT09.SYSDONE
SYSFAIL chain order (BIST engine instance name & FAIL pin
    followed by corresponding Memory Wrapper instance names are listed)
Inst_A.W11_1_BIST1SDBT09.SYSFAIL[1]              Inst_A.W11_1
Inst_A.W11_1_BIST1SDBT09.SYSFAIL[0]              Inst_A.W11_2
Inst_A.W12_1_BIST2SABT09.SYSFAIL[1]              Inst_A.W12_1
Inst_A.W12_1_BIST2SABT09.SYSFAIL[0]              Inst_A.W12_2
W21_1_BIST1SDBT09.SYSFAIL[1]                     W21_1
W21_1_BIST1SDBT09.SYSFAIL[0]                     W21_2
W22_1_BISTDRAMAHCFWRAPT09.SYSFAIL[1]             W22_1
W22_1_BISTDRAMAHCFWRAPT09.SYSFAIL[0]             W22_2
Inst_B.W31_1_BIST2SUBT09.SYSFAIL[1]              Inst_B.W31_1
Inst_B.W31_1_BIST2SUBT09.SYSFAIL[0]              Inst_B.W31_2
Inst_B.W32_1_BIST2RACT09.SYSFAIL[1]              Inst_B.W32_1
Inst_B.W32_1_BIST2RACT09.SYSFAIL[0]              Inst_B.W32_2
```

The daisy chain ordering that is used to identify the pin connections using the part of an organization file is included as part of a description file of Joint Test Action Group (JTAG) capture-shift test data registers. To create such a description file information is extracted from an organization file. The extracted information includes the names of a) a memory built in self test instance, b) a memory built in self test port name, and c) a name of a first memory. This extracted information is then included in a description file that describes JTAG capture-shift test data registers.

In exemplary embodiments, the description file describes a) the memory built in self test instance, b) the memory built in self test port name for each memory built in self test instance port to be observed during a memory test, and c) the name of each corresponding memory instance to be tested during the memory test. Further, the appearance of the names of the memory built in self test instance, the memory built in self test port name, and corresponding memory instance names description file, matches the order of test data registers included in the organization file. In certain embodiments the description file is created, in part, by "flattening" the organization file.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer readable program code/instructions embodied thereon.

Any combination of computer-readable media may be utilized. Computer-readable media may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java™, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

Figure 2:
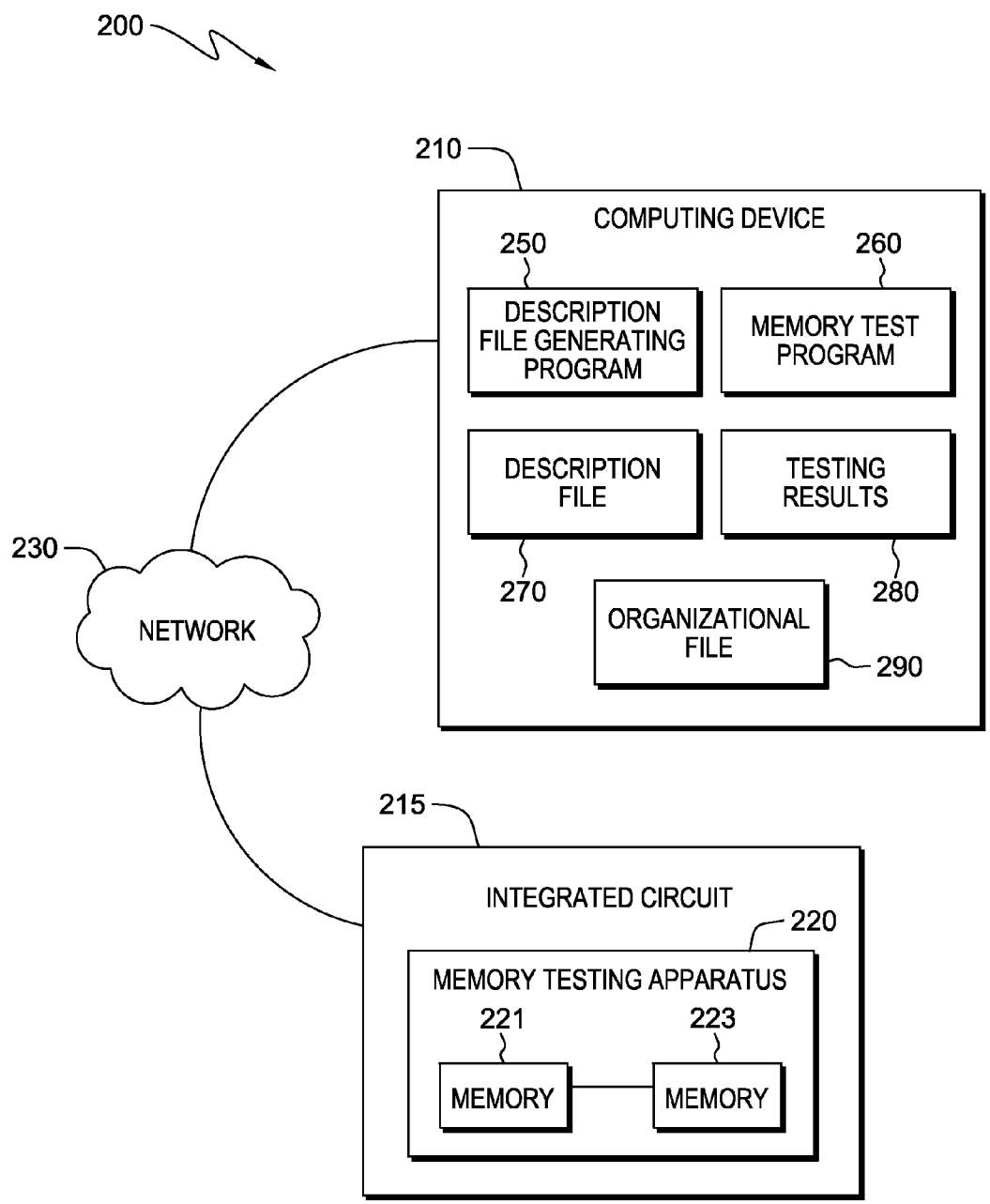
FIG. 2 is a functional block diagram illustrating a memory testing environment, 200, in accordance with an exemplary embodiment.

FIG. 2 is a functional block diagram illustrating a memory testing environment, generally designated 200, in accordance with an exemplary embodiment. Memory testing environment 200 includes computing device 210 and integrated circuit 215 connected via network 230. Computing device 210 includes description file generating program 250, memory test program 260, description file 270, testing results 280, and organizational file 290. Integrated circuit 215 includes memory testing apparatus 220, which further includes memory 221 and 223. Integrated circuit 215 is, in exemplary embodiments, an integrated circuit that includes memory that requires testing, e.g., memory 221 and 223 included in memory testing apparatus 220.

In various embodiments of the present invention, computing device 210 is computing device that can be a standalone device, a server, a laptop computer, a tablet computer, a netbook computer, a personal computer (PC), or a desktop computer. In another embodiment, computing device 210 represents a computing system utilizing clustered computers and components to act as a single pool of seamless resources. In general, computing device 210 can be any computing device or a combination of devices with access to memory testing apparatus 220, description file generating program 250, memory test program 260, description file 270, testing results 280, and organizational file 290, and is capable of executing description file generating program 250 and memory test program 260.

In exemplary embodiments, description file generating program 250, memory test program 260, description file 270, testing results 280, and organizational file 290 are stored on computing device 210. However, in other embodiments, description file generating program 250, memory test program 260, description file 270, testing results 280, and organizational file 290 may be stored externally and accessed through a communication network, such as network 230. Network 230 can be, for example, a local area network (LAN), a wide area network (WAN) such as the Internet, or a combination of the two, and may include wired, wireless, fiber optic or any other connection known in the art. In general, network 230 can be any combination of connections and protocols that will support communications between computing device 210, integrated circuit 215, description file generating program 250, memory test program 260, description file 270, testing results 280, and organizational file 290 in accordance with an exemplary embodiment of the present invention.

In exemplary embodiments, memory testing apparatus 220 is a memory testing apparatus, such as that described in the discussion of FIG. 1, that was simulated on integrated circuit 215, based on an organization file. The components, electrical pathways, and connections therebetween, of memory testing apparatus 220, mimic a) a hierarchical order of components, b) an arrangement of components, and c) electrical connections as indicated by organizational file 290. The inserted components, electrical pathways, and connections therebetween, of memory testing apparatus 220 form a part of a hierarchical in-system test observe structure that is used to test memory, e.g., memory 221 and 223, included in memory testing apparatus 220. Memory 221 and 223 are computer memory, such as cache memory, that need to be tested. For further details regarding the types, organization, and connectivity of components included in memory testing apparatus 220, see the discussion of FIG. 1.

In exemplary embodiments, organizational file 290 indicates the location of components and their respective electrical contacts with a plurality of electrical pathways of the memory testing apparatus 220. Organizational file 290 is used to automatically insert a hierarchical in-system test observe structure, such as that included in memory testing apparatus 220, as well as for the generation of a description file by description file generating program 250.

In exemplary embodiments, description file 270 is a file that describes the Joint Test Action Group (JTAG) capture-shift test data registers included in memory testing apparatus 220. Description file 270 is generated by description file generating program 250 using organizational file 290. For more information regarding the generation of description file 270 see the discussion of FIG. 3.

In exemplary embodiments, testing results 280 are testing results that are generated and analyzed by memory test program 260. Memory test program 260 analyses testing results 280 using description file 270 to identify which memories, such as memory 221 and 223, have passed or failed the memory test.

Figure 3:
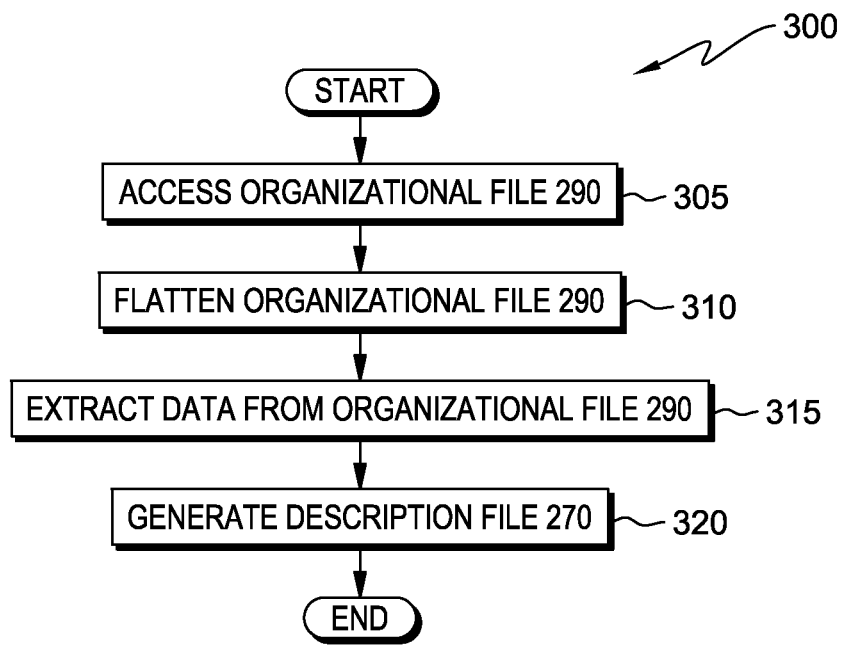
FIG. 3 is a flowchart illustrating the operational steps of a description file generating program, executing on a computing device within the memory testing environment of FIG. 2, in accordance with an exemplary embodiment.

FIG. 3 is a flowchart, 300, illustrating the operational steps executed by description file generating program 250 to generate description file 270, in accordance with an exemplary embodiment.

Description file generating program 250 accesses organizational file 290 and then flattens the file (or files) in steps 305 and 310 respectively. To flatten organizational file 290, description file generating program 250 converts the three dimensional layout of the semiconductor device described by organizational file 290 into a two dimensional representation. In other words the respective layers of components described by organizational file 290 are condensed into a single layer representation.

In step 315, description file generating program 250 extracts data from the "flattened" organizational file 290. The extracted information includes data such as the names of a memory built in self test instance, a memory built in self test port name, and a name of a first memory as described by the flattened organizational file 290.

In step 320, description file generating program 250 generates a description file using the data that was extracted in step 315. Description file generating program 250 then saves the description file as part of description file 270. The information included in description file 270 can then be used to analyze the results of a test of memory that is included in memory testing apparatus 220.

Figure 4:
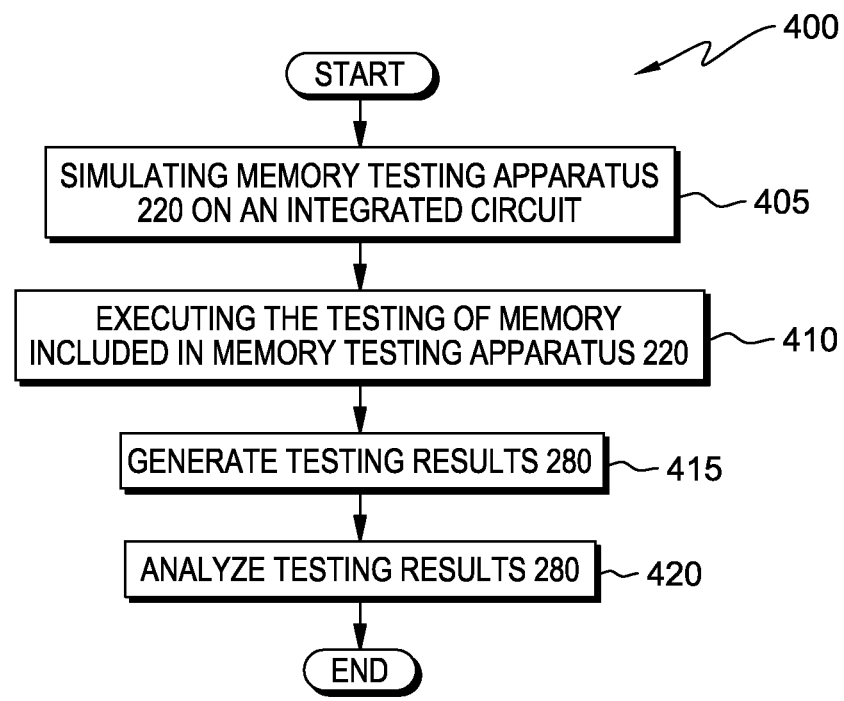
FIG. 4 is a flowchart illustrating the operational steps of a memory test program, executing on a computing device within the program development environment of FIG. 2, in accordance with an exemplary embodiment.

FIG. 4 is a flowchart, 400, illustrating the operational steps executed by memory test program 260 to generate and analyze testing results 280, in accordance with an exemplary embodiment.

In step 405, memory test program 260 simulates, i.e., temporarily generates, memory testing apparatus 220 on integrated circuit 215 using organizational file 290. To simulate memory testing apparatus 220 on integrated circuit 215, memory test program 260 selects a number of components and connections therebetween, which are included in integrated circuit 215, based on the information included in organizational file 290. Together, the selected components and connections form memory testing apparatus 220. For example, integrated circuit 215 is a field programmable gate array (FGPA) based integrated circuit that includes memory 221 and 223, which respectively require testing. Therefore, the simulated memory testing apparatus 220 would include memory 221 and 223 and the components and connections required to form memory testing apparatus 220 based on the information included in organizational file 290. The simulated memory testing apparatus 220 would therefore be able to execute a test of memory 221 and 223.

In step 410, memory test program 260 executes the test of memory included in the memory testing apparatus 220, which is simulated. The results of the memory test are generated and saved as part of testing results 280, in step 415. Then in step 420, memory test program 260 analyzes the data included in testing results 280 using the information included in description file 270 and the results of the analysis are saved as part of testing results 280. For example, the analysis of testing results 280 using the information included in description file 270 indicates that memory 221 has passed the memory test while memory 223 has failed the memory test. The analysis of testing results 280 would therefore respectively reflect that memory 221 passed and memory 223 failed the memory test. The information included in testing results 280 could then be viewed by a user and corrective actions taken to correct for any failed memories included in integrated circuit 215. The information generated by the analysis of testing results 280 would typically include an ordered list of net names, a fully hierarchical instance name, and the SYSDONE or SYSFAIL pin name.

In certain embodiments, memory testing apparatus 220 is not simulated by memory test program 260, on integrated circuit 215. In such a case, memory testing apparatus 220 is a permanent configuration, i.e., is permanently generated, that is included as part of integrated circuit 215. Memory test program 260 would, in such a case, still perform the testing and analysis steps as described in the discussion of FIG. 4.

Figure 5:
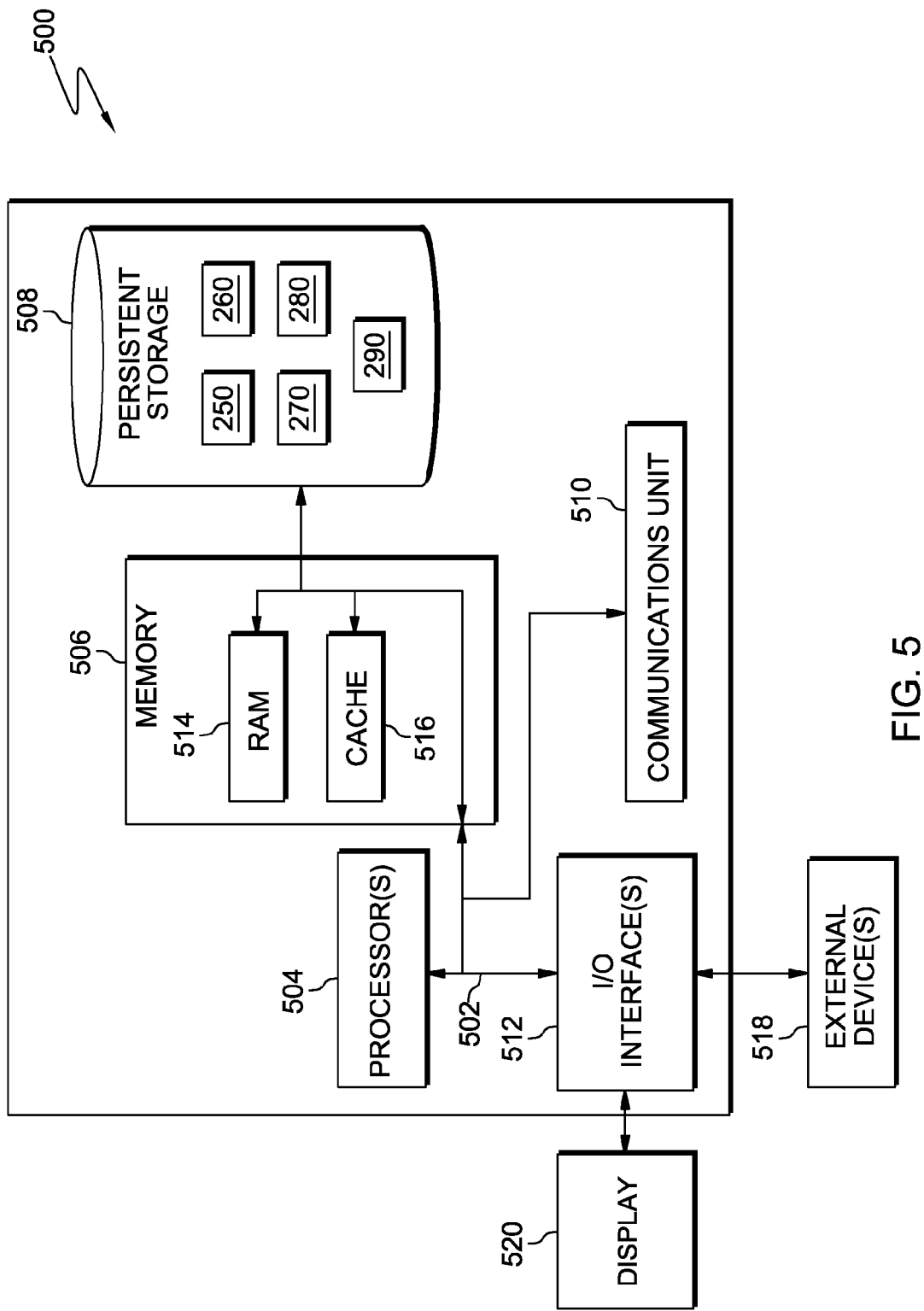
FIG. 5 is depicts a block diagram of components of the computing device executing the description file generating program and the memory test program, in accordance with an exemplary embodiment.

FIG. 5 is depicts a block diagram of components of the computing device that executes description file generating program 250 and memory test program 260, in accordance with an exemplary embodiment.

FIG. 5 depicts a block diagram, 500, of components of computing device 210, in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

Computing device 210 includes communications fabric 502, which provides communications between computer processor(s) 504, memory 506, persistent storage 508, communications unit 510, and input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer-readable storage media. In this embodiment, memory 506 includes random access memory (RAM) 514 and cache memory 516. In general, memory 506 can include any suitable volatile or non-volatile computer-readable storage media.

Description file generating program 250, memory test program 260, description file 270, testing results 280, and organizational file 290 are stored in persistent storage 508 for execution and/or access by one or more of the respective computer processors 504 via one or more memories of memory 506. In this embodiment, persistent storage 508 includes a magnetic hard disk drive. Alternatively, or in addition to a magnetic hard disk drive, persistent storage 508 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer-readable storage medium that is also part of persistent storage 508.

Communications unit 510, in these examples, provides for communications with other data processing systems or devices, including resources of integrated circuit 215. In these examples, communications unit 510 includes one or more network interface cards. Communications unit 510 may provide communications through the use of either or both physical and wireless communications links. Description file generating program 250, memory test program 260, description file 270, testing results 280, and organizational file 290 may be downloaded to persistent storage 508 through communications unit 510.

I/O interface(s) 512 allows for input and output of data with other devices that may be connected to computing device 210. For example, I/O interface 512 may provide a connection to external devices 518 such as a keyboard, keypad, a touch screen, and/or some other suitable input device. External devices 518 can also include portable computer-readable storage media such as, for example, thumb drives, portable optical or magnetic disks, and memory cards. Software and data used to practice embodiments of the present invention, e.g., description file generating program 250, memory test program 260, description file 270, testing results 280, and organizational file 290, can be stored on such portable computer-readable storage media and can be loaded onto persistent storage 508 via I/O interface(s) 512. I/O interface(s) 512 also connect to a display 520.

Display 520 provides a mechanism to display data to a user and may be, for example, a computer monitor, or a television screen.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Embodiments of the present invention may be used in a variety of electronic applications, including but not limited to advanced sensors, memory/data storage, semiconductors, microprocessors and other applications.

A resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having described the preferred embodiment of creating memory testing apparatus/devices/structures (which are intended to be illustrative and not limiting) and description files based on organizational files, and using such memory testing apparatus/devices/structures, description files, and organizational files for the testing of memory included in an integrated circuit, it is noted that modifications and variations may be made by persons skilled in the art in light of the above teachings.

The resulting integrated circuit chips (that incorporate one or more memory testing apparatus) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later come to be known to those of ordinary skill in the art are expressly incorporated herein by reference and intended to be encompassed by the invention. It is therefore to be understood that changes may be made in the particular embodiments disclosed which are within the scope of the present invention as outlined by the appended claims.

Each respective figure, in addition to illustrating the structure of the present invention at various stages, also illustrates the respective steps of the method for the fabrication/manufacture of memory testing apparatus/devices/structures.

What is claimed is:

1. An integrated circuit structure configured for testing integrated circuit memory using a description file of Joint Test Action Group (JTAG) capture-shift test data registers, the structure comprising:

a plurality of components and a plurality of electrical pathways having connections therebetween, wherein an architectural arrangement of the plurality of components, the plurality of electrical pathways, and the connections match a architectural arrangement of components of an integrated circuit controlled by a first data file;

the architectural arrangement of the plurality of components, the plurality of electrical pathways, and the connections comprising:

a reference memory structure that includes at least one first integrated circuit memory that has been tested;

the reference memory structure further including a first input, a second input, a third input, a first output, and a second output;

the first input of the reference memory structure being in electrical contact with a first electrical pathway that is in electrical contact with a first test data register;

the second input of the reference memory structure being in electrical contact with a second electrical pathway that is in electrical contact with a second test data register;

the third input of the reference memory structure being in electrical contact with a third electrical pathway;

the first test data register being in electrical contact with the third electrical pathway and a first built in self test structure using a fourth electrical pathway;

the first built in self test structure being in electrical contact with at least one first integrated circuit memory to be tested using a fifth electrical pathway;

the second test data register being in electrical contact with the third electrical pathway and the first built in self test structure using a sixth electrical pathway;

wherein the first output and the second output carry signals that are interpreted during testing of the at least one first memory; and wherein a description file of Joint Test Action Group (JTAG) capture-shift test data registers is configured to interpret a test result of the first memory.

2. The integrated circuit structure of claim 1, wherein the reference memory structure comprises:

a third test data register in electrical contact with the first input and the first output;

the third test data register being in electrical contact with a second built in self test structure using a sixth electrical pathway;

a fourth test data register in electrical contact with the second input and the second output, the fourth test data register being in electrical contact with the second built in self test structure using a seventh electrical pathway; and the second built in self test structure being in electrical contact, using an eighth electrical pathway, with at least one second integrated circuit memory that has already been tested.

3. The integrated circuit structure of claim 1, wherein the first electrical pathway carries a first reference signal that is used by a computer to determine whether the first memory has failed the test.

4. The integrated circuit structure of claim 1, wherein the second electrical pathway carries a second reference signal that is used by a computer to determine whether the test of the first memory has been completed.

5. The integrated circuit structure of claim 1, wherein the third electrical pathway carries a plurality of control signals that control the test of the first memory.

6. The integrated circuit structure of claim 5, wherein at least one of the plurality of control signals that control the test of the first memory is a test access port controller (TAP) signal.

7. The integrated circuit structure of claim 1, further comprising one or more additional first memory structures, each of which is respectively connected to the first built in self test structure.

8. The integrated circuit structure of claim 7, further comprising one or more additional second test data registers such that each additional first memory structures has a respective corresponding second test data register that is in electrical contact with both the second electrical pathway and third electrical pathway.

9. The integrated circuit structure of claim 1, further comprising one or more additional first built in self test structures each of which is electrically connected to a respective first integrated circuit memory structure and a first test data register.

10. The integrated circuit structure of claim 9, wherein each of the one or more additional first built in self test structures is electrically connected to one or more additional second test data registers such that each of the one or more additional second test data registers corresponds to a respective first memory that is connected to the respective one or more additional first built in self test structures.

11. The integrated circuit structure of claim 1, wherein the first test data registers are electrically connected to the first electrical pathway, and the second test data registers are electrically connected to the second electrical pathway such that signals carried by the first electrical pathway and the second electrical pathway are respectively processed in a an order that corresponds to a processing order indicated by the first data file.

12. The integrated circuit structure of claim 1, wherein the first data file specifies where the first test data registers and the second test data registers are inserted into at least a part of an integrated circuit design such that a serial order of the first test data registers and the second test data registers is defined by the order of memory built in self test sub-components as they appear in the first data file.

13. The integrated circuit structure of claim 12, wherein the first test data registers and the second test data registers are configured to observe the results of a memory built in self test operation that uses a memory built in self test architecture arrangement.

14. A method to produce a description file of Joint Test Action Group (JTAG) capture-shift test data registers to be used to interpret a test result of a memory included in an integrated circuit structure that is configured for testing integrated circuit memory, the method comprising:

a computer extracting, from a first data file the names of a) a memory built in self test instance, b) a memory built in self test port name, and c) a name of a first memory, wherein the first data file controls the architectural arrangement of components of an integrated circuit, wherein the first data file describes an architectural arrangement of the components, electrical pathways, and connections between the components and the electrical pathways of at least a part of an integrated circuit design; and the computer adding the extracted names into a description file that describes JTAG capture-shift test data registers such that the description file is configured to interpret a test result of a memory, wherein, in the description file, an appearance of the names of the memory built in self test instance, the memory built in self test port name for each memory built in self test instance port to be observed during a memory test, and corresponding memory instance to be tested during the memory test names matches an order of a plurality of test data registers included in the organization file, and wherein the memory is included in an integrated circuit structure that is configured for testing integrated circuit memory using the description file of Joint Test Action Group (JTAG) capture-shift test data registers.

15. The method of claim 14, wherein the description file describes a) the memory built in self test instance, b) the memory built in self test port name for each memory built in self test instance port to be observed during a memory test, and c) the name of each corresponding memory instance to be tested during the memory test.

16. The method of claim 14, the method further comprising the step of:

the computer flattening the first data file, wherein the flattening includes converting a three dimensional layout of the integrated circuit described by the first data file into a two dimensional representation.

17. A method of testing a first memory using the integrated circuit structure for testing integrated circuit memory, the method comprising:

a computer generating, on an integrated circuit, an integrated circuit structure for testing integrated circuit memory, wherein the architectural arrangement of the components, electrical pathways, and connections between the components and the electrical pathways of the integrated circuit structure is based on a first data file that controls the architectural arrangement of components of at least a part of an integrated circuit design;

the computer executing a test of an integrated circuit memory using the simulated integrated circuit structure for testing integrated circuit memory;

the computer generating a result of the test; and the computer analyzing the result of the test using a description file of Joint Test Action Group (JTAG) capture-shift test data registers, wherein the description file is based, at least in part, on the first data file and describes a) the memory built in self test instance, b) the memory built in self test port name for each memory built in self test instance port to be observed during a memory test, and c) the name of each corresponding memory instance to be tested during the memory test, wherein, in the description file, an appearance of the names of the memory built in self test instance, the memory built in self test port name for each memory built in self test instance port to be observed during a memory test, and corresponding memory instance to be tested during the memory test names matches an order of a plurality of test data registers included in the organization file.

18. The method of claim 17, the method further comprising the step of:

the computer analyzing the result of the test using a description file of Joint Test Action Group (JTAG) capture-shift test data registers, wherein the description file is based, at least in part, on the first data file and describes a) the memory built in self test instance, b) the memory built in self test port name for each memory built in self test instance port to be observed during a memory test, and c) the name of each corresponding memory instance to be tested during the memory test.

19. The method of claim 17, wherein the computer generates the integrated circuit structure for testing integrated circuit memory by selecting based, at least in part, on the first data file, one or more components, electrical pathways, and connections between the components and the electrical pathways that are included in the integrated circuit which includes the integrated circuit memory.

* * * * *